(12) United States Patent
Chen et al.

(10) Patent No.: US 11,715,721 B2
(45) Date of Patent: Aug. 1, 2023

(54) ELECTRICAL CONNECTING STRUCTURE HAVING NANO-TWINS COPPER

(71) Applicant: National Yang Ming Chiao Tung University, Hsinchu (TW)

(72) Inventors: Chih Chen, Hsinchu (TW); Kai-Cheng Shie, Taichung (TW); Jing-Ye Juang, Hsinchu (TW)

(73) Assignee: NATIONAL YANG MING CHIAO TUNG UNIVERSITY, Hsinchu (TW)

( * ) Notice: Subject to any disclaimer, the term of this patent is extended or adjusted under 35 U.S.C. 154(b) by 105 days.

(21) Appl. No.: 17/447,294

(22) Filed: Sep. 10, 2021

(65) Prior Publication Data
US 2021/0407960 A1  Dec. 30, 2021

Related U.S. Application Data

(62) Division of application No. 16/836,955, filed on Apr. 1, 2020, now Pat. No. 11,145,619.

(30) Foreign Application Priority Data

Jul. 19, 2019  (TW) .................................. 108125724

(51) Int. Cl.
*H01L 23/00*  (2006.01)
(52) U.S. Cl.
CPC .............. *H01L 24/83* (2013.01); *H01L 24/27* (2013.01); *H01L 24/29* (2013.01);
(Continued)
(58) Field of Classification Search
None
See application file for complete search history.

(56) References Cited

U.S. PATENT DOCUMENTS

| 5,792,375 A | 8/1998 | Farquhar |
| 7,736,448 B2 * | 6/2010 | Lu .............................. C22C 1/00 420/490 |

(Continued)

FOREIGN PATENT DOCUMENTS

| CN | 105633038 A | 6/2016 | |
| DE | 102014101552 A1 * | 8/2014 | ........... B23K 1/0016 |

(Continued)

OTHER PUBLICATIONS

Jing-Ye Juang et al., "Low temperature Cu—Cu direct bonding by (111) oriented nano-twin Cu", LTB-3D 2017; Tokyo, Japan; May 16-18, 2017, 1 page. (Year: 2017).*

(Continued)

*Primary Examiner* — Scott B Geyer
(74) *Attorney, Agent, or Firm* — CKC & Partners Co., LLC

(57) ABSTRACT

Disclosed herein is an electrical connecting structure having nano-twins copper, including a first substrate having a first nano-twins copper layer and a second substrate having a second nano-twins copper layer. The first nano-twins copper layer includes a plurality of first nano-twins copper grains. The second nano-twins copper layer includes a plurality of second nano-twins copper grains. The first nano-twins copper layer is joined with the second nano-twins copper layer. At least a portion of the first nano-twins copper grains extend into the second nano-twins copper layer, or at least a portion of the second nano-twins copper grains extend into the first nano-twins copper layer.

7 Claims, 6 Drawing Sheets

(52) U.S. Cl.
CPC ............... *H01L 2224/27462* (2013.01); *H01L 2224/29019* (2013.01); *H01L 2224/29147* (2013.01); *H01L 2224/83091* (2013.01); *H01L 2224/83095* (2013.01); *H01L 2224/83193* (2013.01); *H01L 2224/83345* (2013.01); *H01L 2224/83359* (2013.01); *H01L 2224/83895* (2013.01)

(56) References Cited

U.S. PATENT DOCUMENTS

| | | | |
|---|---|---|---|
| 8,421,225 | B2 | 4/2013 | Ramanathan et al. |
| 8,957,323 | B2 | 2/2015 | Chen et al. |
| 9,666,573 | B1 | 5/2017 | Sukekawa |
| 9,773,741 | B1 | 9/2017 | Gu |
| 9,947,638 | B2 | 4/2018 | Wimplinger et al. |
| 10,141,391 | B2 | 11/2018 | Yang |
| 10,217,725 | B2 | 2/2019 | Yang |
| 2005/0003652 | A1 | 1/2005 | Ramanathan et al. |
| 2006/0021878 | A1 | 2/2006 | Lu et al. |
| 2012/0160903 | A1 | 6/2012 | Saitou et al. |
| 2013/0122326 | A1* | 5/2013 | Chen ............... C25D 5/08 205/291 |
| 2013/0302646 | A1 | 11/2013 | Chen et al. |
| 2014/0042299 | A1 | 2/2014 | Wan et al. |
| 2014/0175655 | A1 | 6/2014 | Chen et al. |
| 2014/0217593 | A1* | 8/2014 | Chen ............... B23K 1/0016 257/762 |
| 2016/0355940 | A1 | 12/2016 | Chen et al. |
| 2017/0062366 | A1 | 3/2017 | Ebqyust |
| 2017/0321339 | A1* | 11/2017 | Chen ............... C25D 21/10 |
| 2018/0019124 | A1 | 1/2018 | Gondcharton et al. |
| 2018/0102251 | A1 | 4/2018 | DeLacruz et al. |
| 2019/0088618 | A1 | 3/2019 | Tsumura et al. |
| 2020/0236782 | A1* | 7/2020 | Ho ............... H01L 23/481 |
| 2020/0279821 | A1 | 9/2020 | Haba et al. |
| 2023/0048311 | A1* | 2/2023 | Bhushan ............... H01L 25/0657 |

FOREIGN PATENT DOCUMENTS

| | | |
|---|---|---|
| TW | I482231 B | 4/2015 |
| TW | I490962 B | 7/2015 |

OTHER PUBLICATIONS

Jing-Ye Juang et al. "Low-resistance and high-strength copper direct bonding in no-vacuum ambient using highly (111)-oriented nano-twinned copper", 2019 IEEE 69th Electronic Components and Technology Conference (ECTC), pp. 642-648 (Year: 2019).*

Yi-Cheng Chu et al. "Anisotropic grain growth to eliminate bonding interfaces in direct copper-to-copper joints using <111>-oriented nanotwinned copper films", Thin Solid Films 667 (2018); pp. 55-58 (Year: 2018).*

Luo et al., "Nanotwin-assisted grain growth in nanocrystalline gold films under cyclic loading", Nature Commuications 5:3021, 2014; 8 pages. (Year: 2014).*

Liu et al., "Low-temperature direct copper-to-copper bonding enabled by creep on (111) surfaces of nanotwinned Cu", Scientific Reports 5:09734, 2015; 11 pages. (Year: 2015).*

H. Takagi et al., "Surface activated bonding of silicon wafers at room temperature", Applied physics letters, vol. 68, Issue 16, pp. 2222-2224, 1996.

Eun-Jung Jang et al., "Effect of Wet Pretreatment on Interfacial Adhesion Energy of Cu—Cu Thermocompression Bond for 3D IC Packages", Journal of Electronic Materials, vol. 38, No. 12, 2009.

Ya-Sheng Tang et al., "Wafer-level Cu—Cu bonding technology", Microelectronics Reliability, vol. 52, Issue 2, pp. 312-320, 2012.

Wenhua Yang et al., "Effect of Formic Acid Vapor In Situ Treatment Process on Cu Low-Temperature Bonding", IEEE Transactions on Components, Packaging and Manufacturing Technology, vol. 4, No. 6, pp. 951-956, Jun. 2014.

Jing-Ye Juang et al., "Copper-to-copper direct bonding on highly (111)-oriented nanotwinned copper in no-vacuum ambient", Scientific Reports, vol. 8, No. 13910, 2018.

* cited by examiner

ELECTRICAL CONNECTING STRUCTURE HAVING NANO-TWINS COPPER

CROSS-REFERENCE TO RELATED APPLICATION

The present application is a Divisional Application of the U.S. application Ser. No. 16/836,955, filed on Apr. 1, 2020, which claims priority to Taiwan Application Serial Number 108125724, filed Jul. 19, 2019, all of which are herein incorporated by reference in their entireties.

BACKGROUND

Field of Invention

The present invention relates to an electrical connecting structure. More particularly, the present invention relates to an electrical connecting structure having nano-twins copper.

Description of Related Art

Since integrated circuit chips and various electronic products proceed to develop in smaller sizes, the electrical connections between different electronic components in electronic products have also evolved towards smaller dimensions accordingly. Connecting pads with a dimension of micrometers or nanometers are widely used in components of various electronic products. Joining the connecting pads with a dimension of micrometers or nanometers is crucial as the joining quality directly affects the performance, quality and reliability of the final electronic products. When the size shrinks, adverse effects of intermetallic compounds produced by conventional tin contacts and copper will increase in terms of the mechanical properties of the joined structure, resulting in a decrease in the reliability of the final products. Accordingly, there is an urgent call for an improved electrical connecting structure and a forming method thereof to address the problems.

SUMMARY

One aspect of the present disclosure provides a method of forming an electrical connecting structure having nano-twins copper. The method comprises: (i) forming a first nano-twins copper layer comprising a plurality of first nano-twins copper grains; (ii) forming a second nano-twins copper layer comprising a plurality of second nano-twins copper grains; and (iii) joining a surface of the first nano-twins copper layer with a surface of the second nano-twins copper layer, such that at least a portion of the first nano-twins copper grains grow into the second nano-twins copper layer, or at least a portion of the second nano-twins copper grains grow into the first nano-twins copper layer.

In some embodiments, a joining interface is formed in the step of joining the surface of the first nano-twins copper layer with the surface of the second nano-twins copper layer, in which at least a portion of the first nano-twins copper grains grow across the joining interface, or at least a portion of the second nano-twins copper grains grow across the joining interface.

In some embodiments, the first nano-twins copper grains and the second nano-twins copper grains are substantially columnar, and a width of each of the first nano-twins copper grains and the second nano-twins copper grains is less than 5 micrometers.

In some embodiments, a joining interface is formed in the step of joining the surface of the first nano-twins copper layer with the surface of the second nano-twins copper layer, in which at least 20% by amount of the first nano-twins copper grains grow across the joining interface, or at least 20% by amount of the second nano-twins copper grains grow across the joining interface.

In some embodiments, a height of each of the first nano-twins copper grains growing across the joining interface is at least 30% of a thickness of the second nano-twins copper layer; or a height of each of the second nano-twins copper grains growing across the joining interface is at least 30% of a thickness of the first nano-twins copper layer.

In some embodiments, the step of joining the surface of the first nano-twins copper layer with the surface of the second nano-twins copper layer comprises applying a pressure on at least one of the first nano-twins copper layer and the first nano-twins copper layer, such that the surface of the first nano-twins copper layer and the surface of the second nano-twins copper layer are joined under the pressure. The pressure ranges from about 0.8 Mpa to about 3 Mpa.

In some embodiments, the pressure ranges from about 0.8 Mpa to about 1.5 Mpa.

In some embodiments, the step of joining the surface of the first nano-twins copper layer with the surface of the second nano-twins copper layer is performed under a temperature of 200° C. to about 350° C.

In some embodiments, the step of joining the surface of the first nano-twins copper layer with the surface of the second nano-twins copper layer is performed under an ambient pressure of about $10^{-3}$ Torr to about $10^{-1}$ Torr.

In some embodiments, a joining time in the step of joining the surface of the first nano-twins copper layer with the surface of the second nano-twins copper layer ranges from about 1 minute to about 30 minutes.

In some embodiments, in which the first nano-twins copper grains and the second nano-twins copper grains are formed and stacked in a direction of [111] crystallographic axis.

In some embodiments, the surface of the first nano-twins copper layer and the surface of the second nano-twins copper layer each comprises a (111) crystal plane.

Another aspect of the present disclosure provides an electrical connecting structure having nano-twins copper. The electrical connecting structure has a first substrate and a second substrate. The first substrate has a first nano-twins copper layer comprising a plurality of first nano-twins copper grains. The second substrate has a second nano-twins copper layer comprising a plurality of second nano-twins copper grains. The first nano-twins copper layer is joined with the second nano-twins copper layer. At least a portion of the first nano-twins copper grains extend into the second nano-twins copper layer or at least a portion of the second nano-twins copper grains extend into the first nano-twins copper layer.

In some embodiments, the first substrate and the second substrate each comprises an oxide layer and a metal layer, in which the first nano-twins copper layer is positioned on the metal layer of the first substrate, and the second nano-twins copper layer is positioned on the metal layer of the second substrate.

In some embodiments, the electrical connecting structure further comprises a joining interface between the first nano-twins copper layer and the second nano-twins copper layer. At least 20% by amount of the first nano-twins copper grains extend across the joining interface or at least 20% by amount of the second nano-twins copper grains extend across the joining interface.

In some embodiments, a height of each of the first nano-twins copper grains extending across the joining interface is at least 30% of a thickness of the second nano-twins copper layer. Alternatively, a height of each of the second nano-twins copper grains extending across the joining interface is at least 30% of a thickness of the first nano-twins copper layer.

In some embodiments, the height of each of the first nano-twins copper grains extending across the joining interface ranges from about 0.1 micrometer to about 20 micrometers.

In some embodiments, the first nano-twins copper grains and the second nano-twins copper grains are substantially columnar.

In some embodiments, a width of each of the first nano-twins copper grains and the second nano-twins copper grains is less than 5 micrometers.

In some embodiments, the first nano-twins copper grains and the second nano-twins copper grains are formed and stacked in a direction of [111] crystallographic axis.

DETAILED DESCRIPTION

Figure 1:
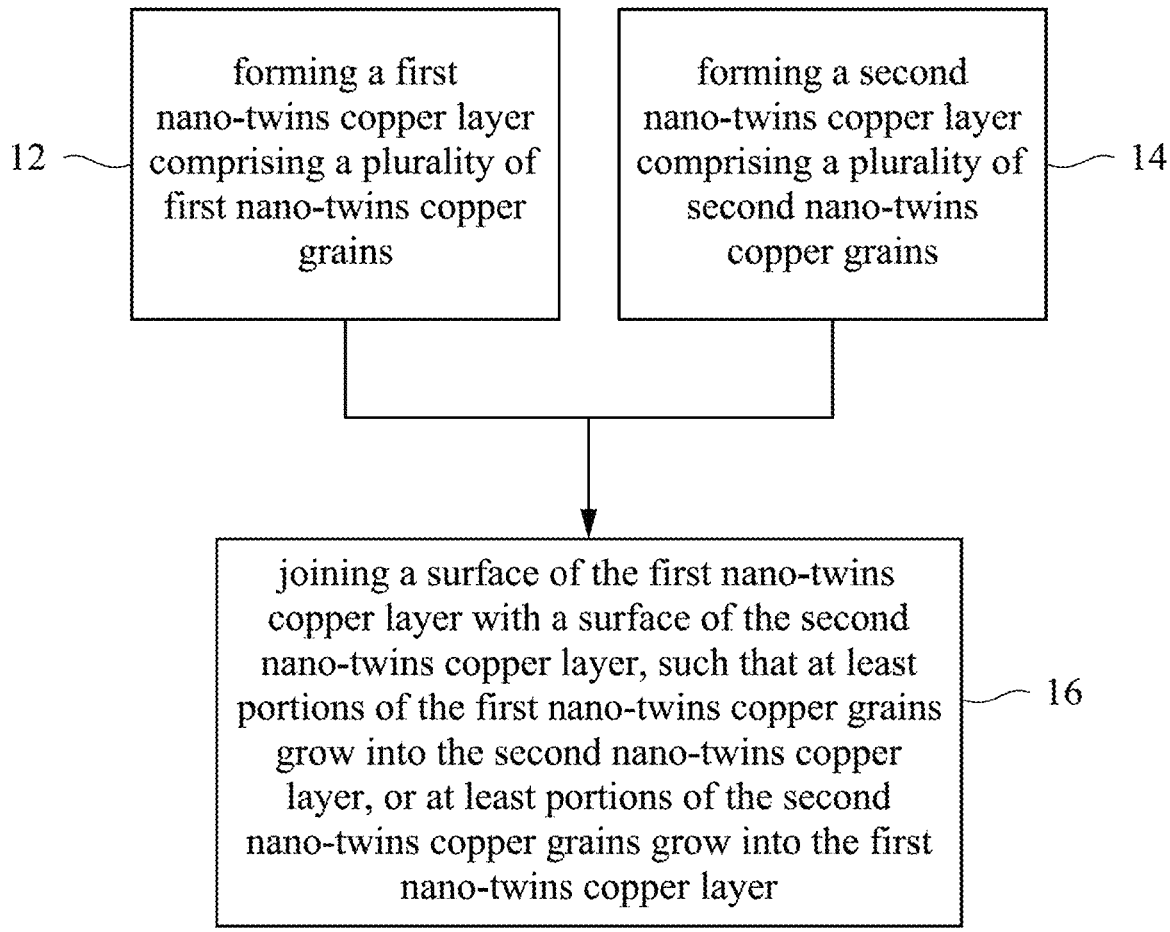
FIG. 1 shows a flowchart of a method for forming an electrical connecting structure having nano-twins copper according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. The embodiments disclosed below can be combined or replaced with each other under advantageous circumstances, and other embodiments can be added to an embodiment without further description or description.

In the following description, many specific details will be described in detail to enable the reader to fully understand the following embodiments. However, embodiments of the present disclosure may be practiced without such specific details. In other cases, in order to simplify the drawing, well-known structures and devices are only schematically shown in the drawing.

Spatial relative terms such as "below," "under," "above," "over," etc. are used herein to aid the description of the relative relationship between one element or feature and another element or feature shown in the drawings. The actual meaning of these spatial relative terms includes other orientations. For example, when the drawing is flipped 180 degrees, the spatial relationship between one element and another element may change from "below," "under" to "above," "over". In addition, the spatial relative description used in the context should be interpreted similarly.

Figure 2:
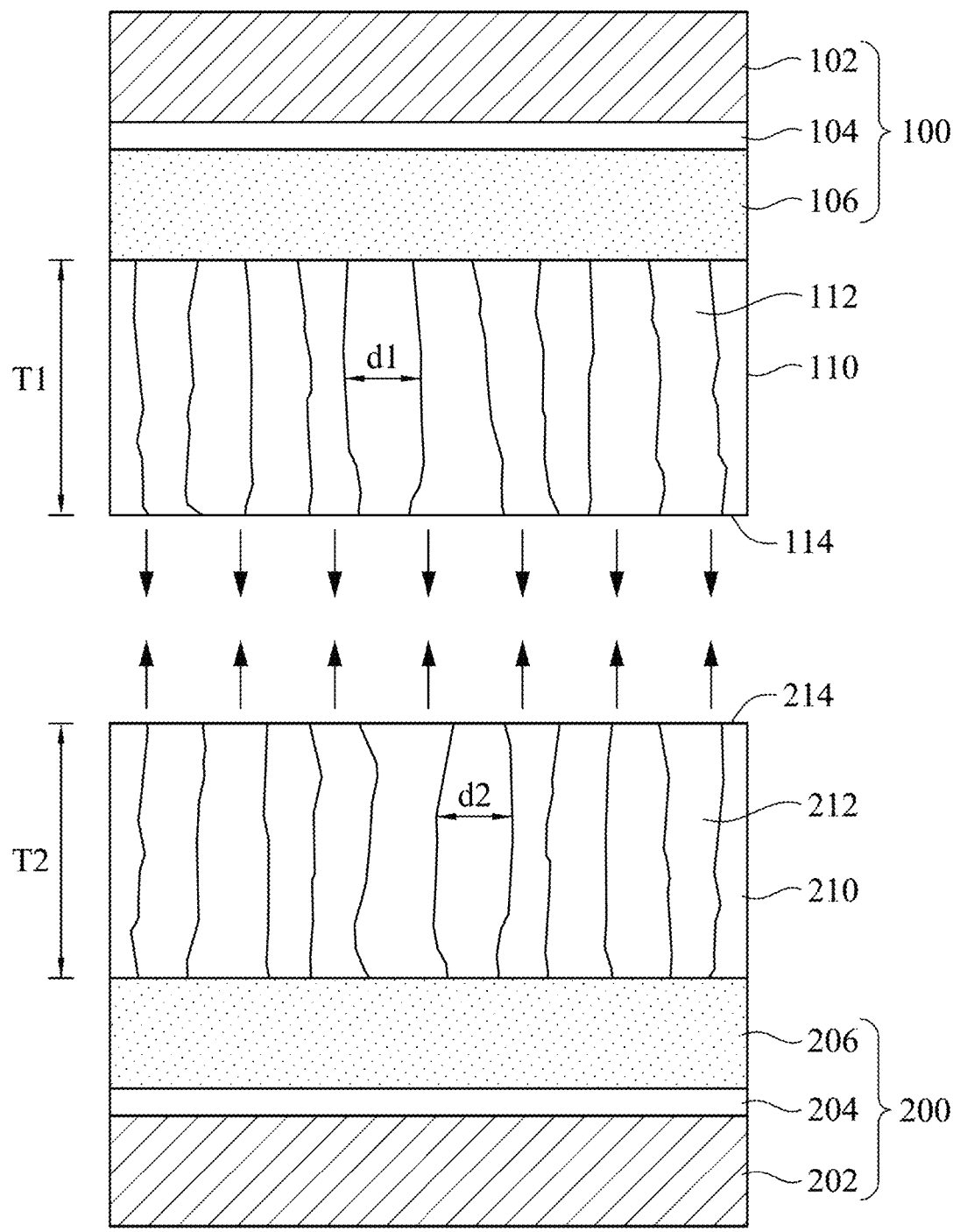
FIG. 2 is a schematic cross-sectional view illustrating a process stage in the method according to some embodiments of the present disclosure.
Figure 4:
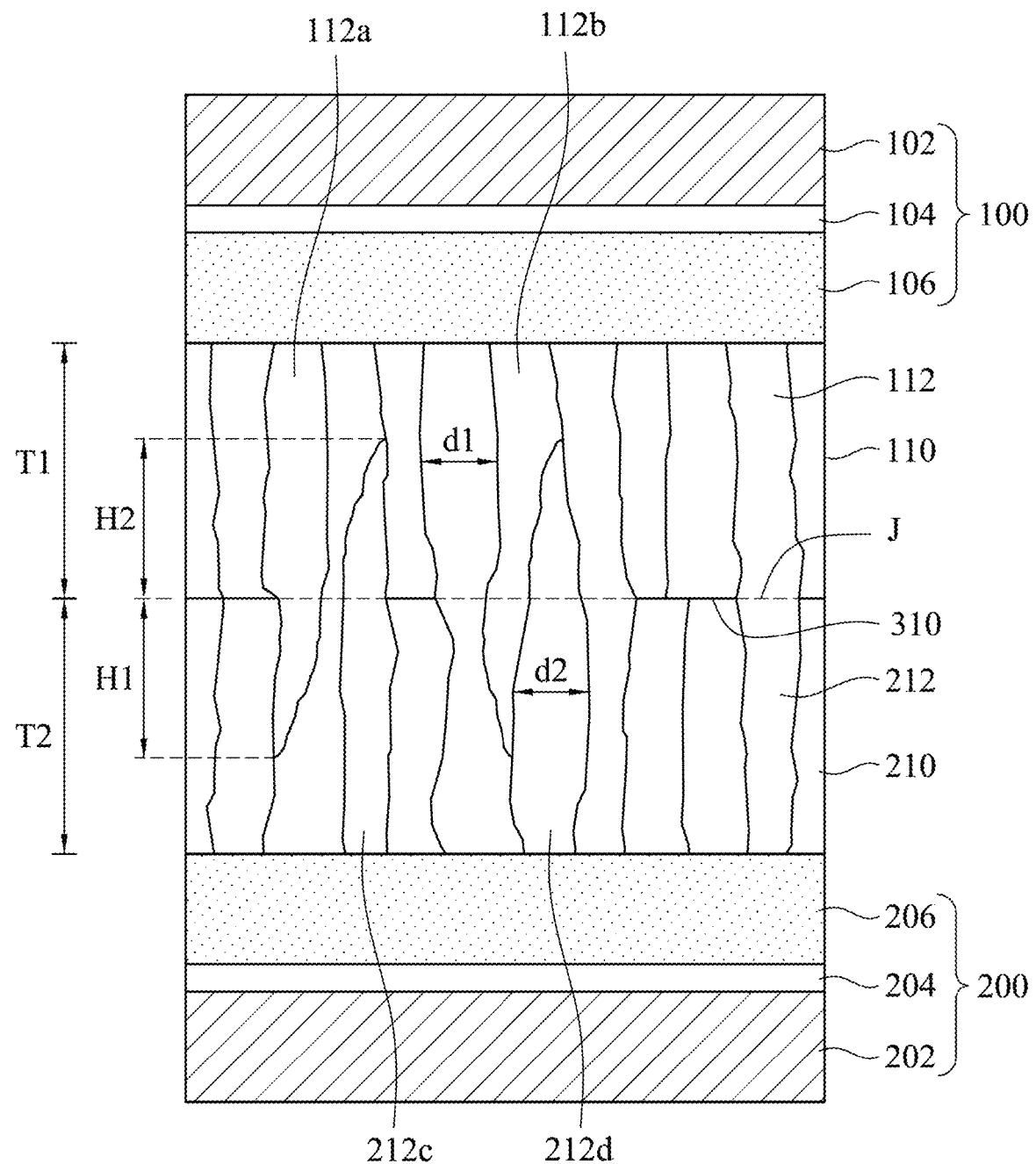
FIG. 4 is a schematic cross-sectional view illustrating a process stage in the method according to some embodiments of the present disclosure.

One aspect of the present disclosure provides a method of forming an electrical connecting structure having nano-twins copper. FIG. 1 shows a flowchart of method 10 for forming an electrical connecting structure having nano-twins copper according to various embodiments of the present disclosure. The method 10 includes operation 12, operation 14, and operation 16. FIG. 2 and FIG. 4 schematic cross-sectional view at different process stages in method 10 according to some embodiments of the present disclosure.

At operation 12, a first nano-twins copper layer 110 is formed, as shown in FIG. 2. The first nano-twins copper layer 110 comprises a plurality of first nano-twins copper grains 112. In various embodiments, the first nano-twins copper layer 110 is formed over a first preliminary substrate 100. For example, the first preliminary substrate 100 comprises a first substrate 102 and a first metal layer 106. The first metal layer 106 is an underlayer that helps to form nano-twins copper. In one example, the first metal layer 106 includes a titanium layer and a copper layer formed thereon. The titanium layer and the copper layer may be formed using a suitable deposition method such as physical vapor deposition (for example, a sputtering process) or chemical plating. The thickness of each of the titanium layer and the copper layer may be such as tens of nanometers to hundreds of nanometers. The first substrate 102 may be any suitable substrates, such as a silicon substrate, a ceramic substrate, a glass fiber substrate, a printed circuit board, a metal substrate, a plastic substrate, and the like. In the case the first substrate 102 is a silicon wafer or a wafer, an oxide layer 104 such as silicon oxide may be formed on the first substrate 102, and the first metal layer 106 may be formed on the oxide layer 104.

In some embodiments, the first nano-twins copper layer 110 having (111) crystal plane may be formed on the first metal layer 106 of the first preliminary substrate 100 by using an electroplating process. In a specific example, a solution used in the electroplating process may include 50 g/L of $Cu^{2+}$, 100 g/L of $SO_4^{2}+$, 50 ppm of $Cl^-$, and 4.5 mL/L of additive (Chemleader Corporation, Model 041). In the electroplating process, the current density is 4-8 $A/dm^2$ (ASD), the electroplating temperature is 25±3° C., the electroplating time is about 5 minutes, and the stirring rate of the electroplating solution during the electroplating process is 1200 rpm. During the electroplating process, the first nano-twins copper layer 110 is stacked and grows along a direction of [111] crystallographic axis, and a surface 114 of the first nano-twins copper layer 110 grows into a (111) crystal plane.

In detail, a plurality of first nano-twins copper grains 112 are formed in the first nano-twins copper layer 110. Each of the first nano-twins copper grains 112 are substantially columnar. In other words, the first nano-twins copper grains 112 are substantially columnar twinned grain and positioned adjacent to each other. In some embodiments, a width d1 of the first nano-twins copper grains 112 is less than about 5 micrometers, preferably about 0.1 micrometer to about 2 micrometers, such as about 0.1, 0.2, 0.5, 0.8, 1.0, 1.5, 2, 2.5, 3.0, 3.5, 4.0 micrometers. The term "width" used herein refers to the radial width of the first nano-twins copper grains 112. According to various examples, the width d1 of the first nano-twins copper grains 112 within this specific range provides advantageous technical effects, which will be described below in more detail.

According to some embodiments of the present disclosure, after the formation of the first nano-twins copper layer 110 by electroplating, a planarization process may be selectively performed to reduce the roughness of the surface 114 of the first nano-twins copper layer 110. In some examples, the planarization process may be performed by using a chemical mechanical polishing technique. After the planarization process is performed, the roughness of the surface 114 of the first nano-twins copper layer 110 ranges from about 0.5 nm to about 10 nm (Ra), such as about 1 nm, 2 nm, 3 nm, 4 nm, or 5 nm. After the planarization process is performed, a thickness T1 of the first nano-twins copper layer 110 ranges from about tens of nanometers to about tens of micrometers, such as about 0.5 μm to about 10 μm.

Figure 3:
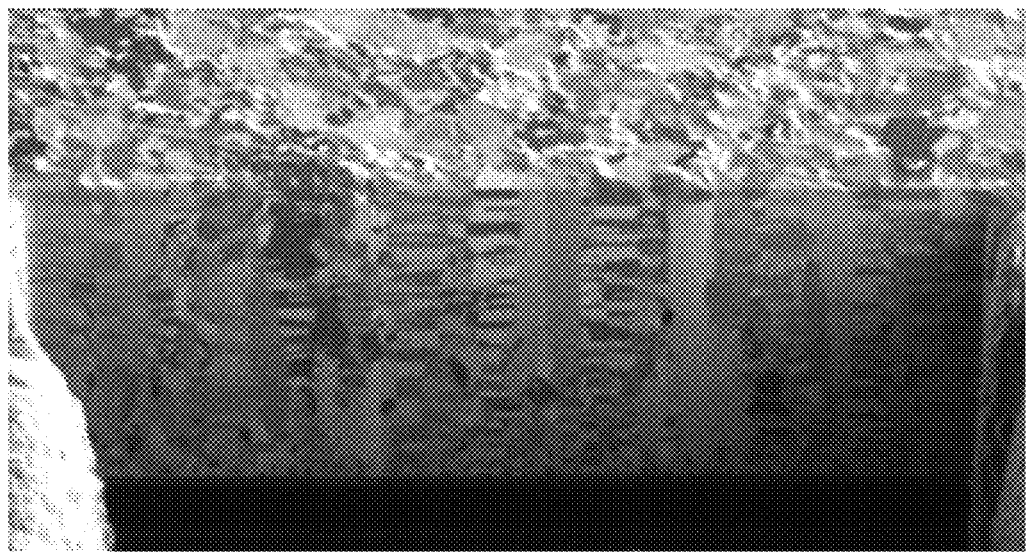
FIG. 3 is a focused ion beam (FIB) image of the first nano-twins copper layer according to one example of the present disclosure.

FIG. 3 is a focused ion beam (FIB) image of the first nano-twins copper layer according to one example of the present disclosure. The grain boundaries of the columnar twinned grains and the stacked structure of twins-copper layer in each columnar twinned grains are clearly shown in FIG. 3.

At operation 14, a second nano-twins copper layer 210 is formed, as shown in FIG. 2. In some embodiments, the second nano-twins copper layer 210 is formed over a second preliminary substrate 200. The specific embodiments of the second preliminary substrate 200 may be the same or similar to those of the first preliminary substrate 100. For example, the second preliminary substrate 200 includes a second substrate 202, a second oxide layer 204, and a second metal layer 206. The specific forming method for forming the second nano-twins copper layer 210 may be the same or similar to the method for forming the first nano-twins copper layer 110. In brief, the second nano-twins copper layer 210 may be formed on the second preliminary substrate 200 using an electroplating process. The second nano-twins copper layer 210 is stacked and grows along a direction of [111] crystallographic axis, and the surface 214 of the second nano-twins copper layer 210 grows into a (111) crystal plane. The second nano-twins copper layer 210 comprises a plurality of second nano-twins copper grains 212. Each of the second nano-twins copper grains 212 are substantially columnar. In some embodiments, a width d2 of the second nano-twins copper grains 212 is less than about 5 micrometers, preferably about 0.1 micrometer to about 2 micrometers, such as about 0.1, 0.2, 0.5, 0.8, 1.0, 1.5, 2, 2.5, 3.0, 3.5, 4.0 micrometers. According to various examples, the width d2 of the second nano-twins copper grains 212 within this specific range provides advantageous technical effects, which will be described below in more detail.

In some examples, the width d2 of the second nano-twins copper grains 212 and the width d1 of the first nano-twins copper grains 112 are in the same magnitude order. In a specific example, the width d2 of the second nano-twins copper grains 212 is substantially the same or similar to the width d1 of the first nano-twins copper grains 112. The terms "same" or "similar" may be construed as the difference between the average value of the width d1 and the average value of the width d2 is within ±50% (more specifically within ±30%), or within the scope commonly recognized by those skilled in the art. However, in other examples, the width d2 of the second nano-twins copper grains 212 may be greater than or less than the width d1 of the first nano-twins copper grains 112.

After the formation of the second nano-twins copper layer 210 by using an electroplating process, a planarization process may be selectively performed to reduce the roughness of the surface 214 of the second nano-twins copper layer 210. After performing the planarization process, the roughness of the surface 214 of the second nano-twins copper layer 210 ranges from about 0.5 nm to about 10 nm (Ra), preferably about 0.5 nm to about 5 nm, such as about 1 nm, 2 nm, 3 nm, 4 nm, or 5 nm. After performing the planarization process, a thickness T2 of the second nano-twins copper layer 210 may range from about tens of nanometers to about tens of micrometers, such as about 0.5 μm to about 10 μm. The thickness T2 of the second nano-twins copper layer 210 may be the same or different from the thickness T1 of the first nano-twins copper layer 110.

According to some embodiments of the present disclosure, after the first nano-twins copper layer 110 and/or the second nano-twins copper layer 210 are formed, a cleaning process may be performed on the first nano-twins copper layer 110 and/or the second nano-twins copper layer 210. For example, the first nano-twins copper layer 110 and/or the second nano-twins copper layer 210 is soaked in a saturated citric acid solution at about 50~80° C. for about 30-120 seconds and is then rinsed with deionized water and blow dry with nitrogen.

There is no restriction on the sequential order of the operation 12 and the operation 14. For example, the operation 12 may be performed before the operation 14. Alternatively, the operation 14 may be performed before the operation 12. Otherwise, the operation 12 and the operation 14 may be performed in parallel or simultaneously.

At operation 16, as shown in FIG. 4, the surface 114 of the first nano-twins copper layer 110 is joined with the surface 214 of the second nano-twins copper layer 210, such that at least a portion of the first nano-twins copper grains 112 grow into the second nano-twins copper layer 210, or at least a portion of the second nano-twins copper grains 212 grow into the first nano-twins copper layer 110.

In some embodiments, a pressure is applied on at least one of the first nano-twins copper layer 110 and the first nano-twins copper layer 110, such that the surface 114 of the first nano-twins copper layer 110 and the surface 214 of the second nano-twins copper layer 210 are joined under the pressure. For example, a pressure of about 0.8 Mpa to about 3 Mpa may be applied on the back side of the first preliminary substrate 100 and/or the second preliminary substrate 200, such that the surface 114 of the first nano-twins copper layer 110 is joined with the surface 214 of the second nano-twins copper layer 210 under the pressure. In various examples, the pressure ranges from about 0.8 Mpa to about 1.5 Mpa, such as about 0.8 Mpa, 1.0 Mpa, 1.2 Mpa, or 1.5 Mpa. In some embodiments, the step of joining the surface 114 of the first nano-twins copper layer 110 with the surface 214 of the second nano-twins copper layer 210 is performed under a temperature ranging from 200° C. to about 350° C., preferably under a temperature ranging from about 250° C. to about 320° C., such as about 250° C., 280° C., 300° C., or 320° C. In some embodiments, the step of joining the first nano-twins copper layer 110 with the second nano-twins copper layer 210 is performed under a vacuum environment with an ambient pressure of about $10^{-3}$ Torr to about $10^{-1}$ Torr. In some embodiments, the joining time is about 1 minute to about 30 minutes. The process conditions provide advantageous technical effects, which will be described below in more detail.

As shown in FIG. 4, after joining, a portion of the first nano-twins copper grains 112 is merged with a portion of the second nano-twins copper grains 212, such that a plurality of nano-twins copper grains (which is referred to as "merged nano-twins copper grains" hereinafter) spanning across an initial joining junction J are formed and are exemplary illustrated as 112a, 112b in FIG. 4. In other words, at least a certain amount of the first nano-twins copper grains 112 grow and merge with the second nano-twins copper grains 212 in the opposite direction and extend into the second nano-twins copper layer 210. Alternatively, at least a certain amount of the second nano-twins copper grains 212 grow and merge with the first nano-twins copper grains 112 in the opposite direction and extend into the first nano-twins copper layer 110, such as 212c, 212d in FIG. 4. Therefore, in some embodiments, the surface 114 of the first nano-twins copper layer 110 and the surface 214 of the second nano-twins copper layer 210 as joined form a discontinuous the joining interface 310. It is noted that the joined "merged nano-twins copper grains" (112a, 112b, 212c, 212d in FIG. 4) remain the stacked structure of nano-twins copper, and a width of the "merged nano-twins copper grains" is in the same magnitude order with the width of the first nano-twins copper grains 112 and/or the second nano-twins copper grains 212.

In some embodiments, at least 20% by amount of the first nano-twins copper grains 112 (such as 20%, 30%, 40%, 50%, 60%, 80%, or 100%) grow across the joining interface 310 (such as 112a, 112b in FIG. 4), or at least 20% by amount of the second nano-twins copper grains 212 (such as 20%, 30%, 40%, 50%, 60%, 80%, or 100%) grow across the joining interface 310 (such as 212c, 212d in FIG. 4). According to some other embodiments, when most of the first nano-twins copper grains 112 and the second nano-twins copper grains 212 are merged with each other, such as more than 60% by amount of the first nano-twins copper grains 112 and/or the second nano-twins copper grains 212 are merged to form the "merged nano-twins copper grains," the initial joining junction will become inconspicuous, causing the initial joining junction hard to be observed.

In various examples, after the joining step, a height H2 of the "merged nano-twins copper grains" 212c, 212d across the joining interface 310, which is formed by the growth of the second nano-twins copper grains 212 that grow in a direction towards the first nano-twins copper grains 112, is at least 30% of the thickness T1 of the first nano-twins copper layer 110, such as 35%, 40%, 45%, 50%, 55%, 60%, 65%, 70%, 75%, 80%, 85%, 90%, 95% or 100%. Alternatively, a height H1 of the "merged nano-twins copper grains" 112a, 112b across the joining interface 310, which is formed by the growth of the first nano-twins copper grains 112 that grow in a direction towards the second nano-twins copper grains 212, is at least 30% of the thickness T2 of the second nano-twins copper layer 210, such as 35%, 40%, 45%, 50%, 55%, 60%, 65%, 70%, 75%, 80%, 85%, 90%, 95%, or 100%. In some other embodiments, a certain amount of the "merged nano-twins copper grains" penetrates through the first nano-twins copper layer 110 and the second nano-twins copper layer 210, and therefore the height of the certain amount of the merged nano-twins copper grains" is the sum of the thickness T1 of the first nano-twins copper layer 110 and the thickness T2 of the second nano-twins copper layer 210.

Figure 5:
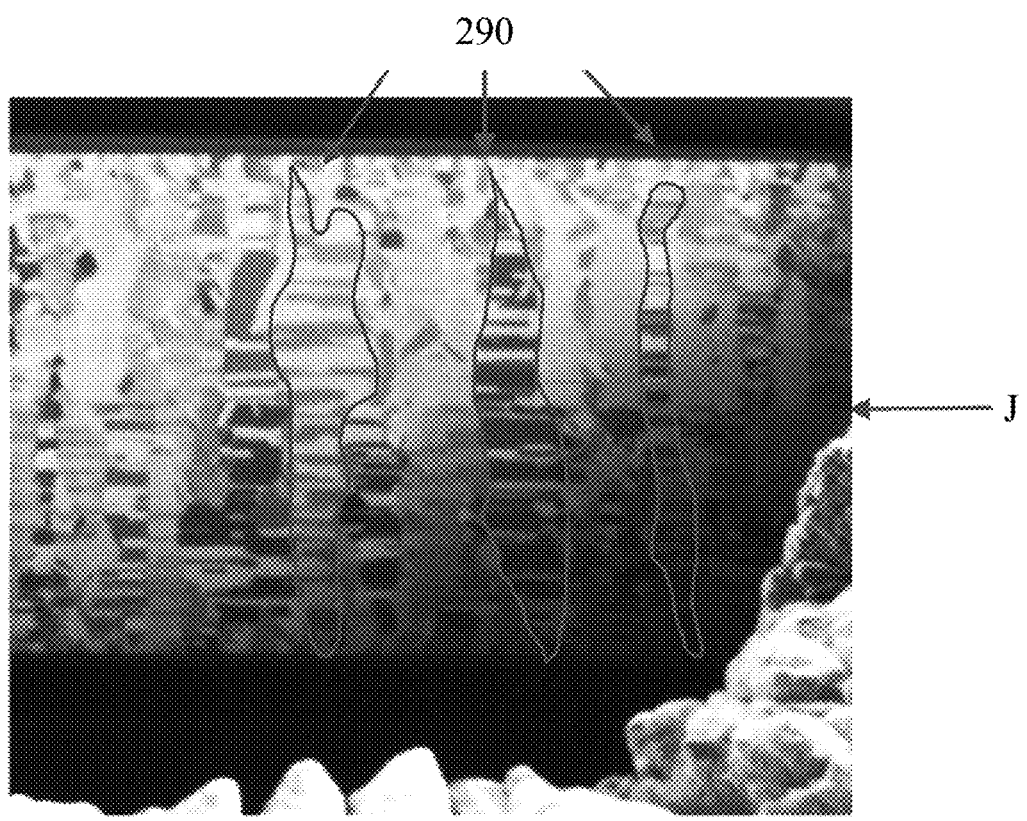
FIG. 5 is a focused ion beam (FIB) image of an electrical connecting structure in one example of the present disclosure.

FIG. 5 is a focused ion beam (FIB) image of an electrical connecting structure after operation 16 in one example of the present disclosure. In order to enable those skilled in the art to more easily understand features of the present disclosure, the joining junction J is marked in FIG. 5, and the "merged nano-twins copper grains" 290 is indicated by solid line.

As mentioned above, the process conditions and features provide advantageous technical effects. For example, the width d1 of the first nano-twins copper grains 112 that is less than about 5 micrometers (preferably about 0.1 micrometer to about 2 micrometers) and the width d2 of the second nano-twins copper grains 212 that is less than about 5 micrometers (preferably about 0.1 micrometer to about 2 micrometers) are favorable in the merging of the first nano-twins copper grains and the second nano-twins copper grains to form the "merged nano-twins copper grains". If the first nano-twins copper grains and the second nano-twins copper grains are too large, the merging of the first nano-twins copper grains and the second nano-twins copper grains is obstructed. In addition, for example, joining the first nano-twins copper layer 110 and the second nano-twins copper layer 210 under a pressure of about 0.8 Mpa to about 3 Mpa (preferably about 0.8 Mpa to about 1.5 Mpa) is also favorable in the merging of the first nano-twins copper grains and the second nano-twins copper grains. Moreover, for example, joining under a temperature of about 200° C. to about 350° C., preferably about 250° C. to about 320° C. is also favorable in the merging of the first nano-twins copper grains and the second nano-twins copper grains and to maintain the crystal structure and grain size of the nano-twins copper. Moreover, for example, the surface roughness of the nano-twins copper layer, which preferably ranges from about 0.5 nm to about 5 nm, is also favorable in the merging of the first nano-twins copper grains and the second nano-twins copper grains.

From the above disclosure, those skilled in the art to which the present invention pertains can understand that, since nano-twins copper grains on one side grow towards the nano-twins copper grains on the opposite side and merge therewith, the electrical connecting structure formed therefrom can achieve improved mechanical strength, conductivity, stability and reliability.

Figure 6:
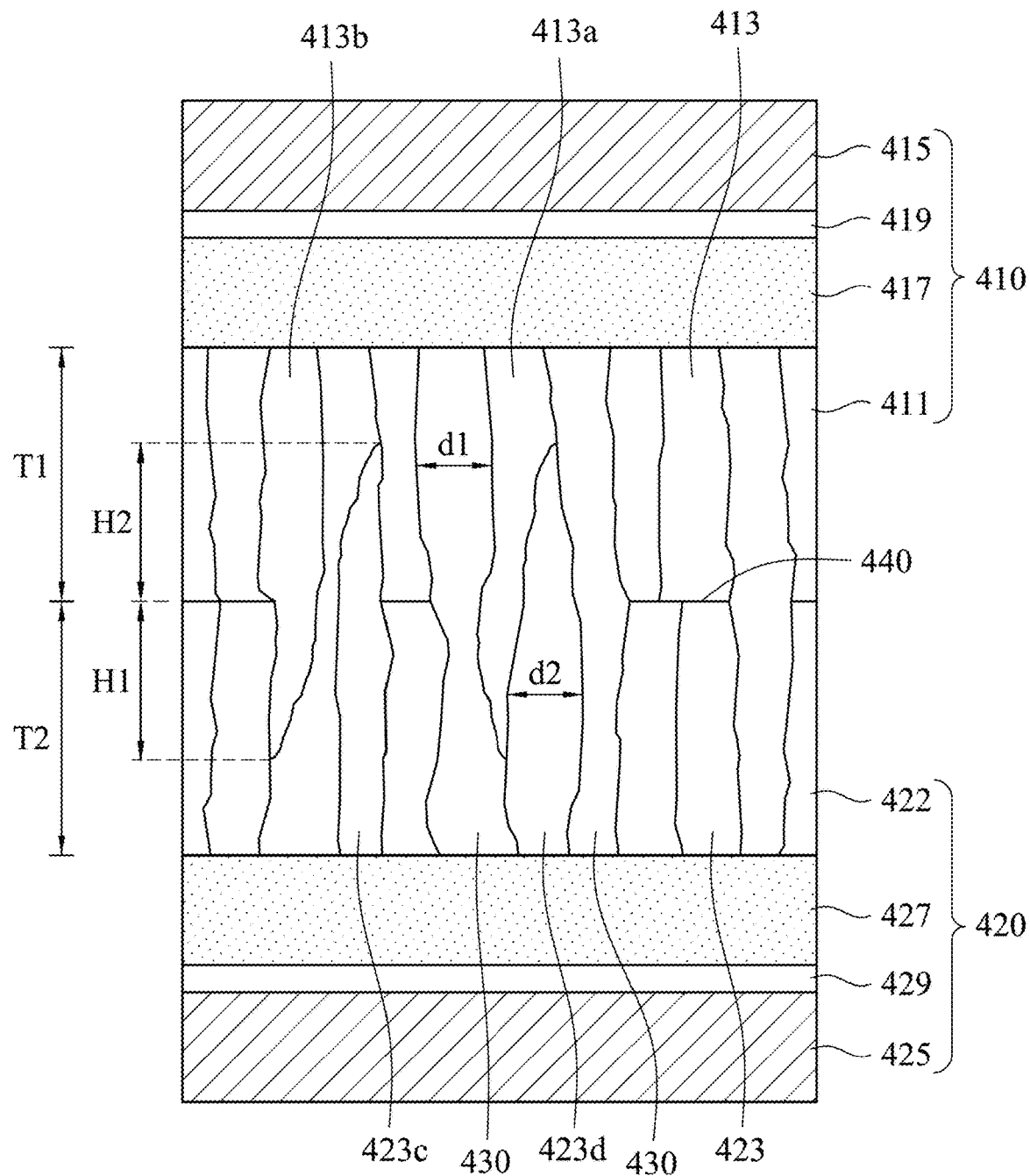
FIG. 6 is a schematic cross-sectional view of an electrical connecting structure according to various embodiments of the present invention.

Another aspect of the present disclosure provides an electrical connecting structure having nano-twins copper. FIG. 6 is a schematic cross-sectional view of an electrical connecting structure 400 according to various embodiments of the present disclosure. The electrical connecting structure 400 comprises a first substrate 410 and a second substrate 420.

The first substrate 410 includes a first nano-twins copper layer 411 having a plurality of first nano-twins copper grains 413. Similarly, the second substrate 420 includes a second nano-twins copper layer 422 having a plurality of second nano-twins copper grains 423. The first nano-twins copper layer 411 and the second nano-twins copper layer 422 are joined and connected. In various embodiments, the first nano-twins copper grains 411 and the second nano-twins copper grains 423 are substantially columnar, and a width of each of the first nano-twins copper grains 411 and the second nano-twins copper grains 423 is less than about 5 micrometers, preferably about 0.1 micrometer to about 2 micrometers. In various embodiments, the first nano-twins copper grains 411 and the second nano-twins copper grains 423 are stacked along a direction of [111] crystallographic axis.

It is noted that a certain amount of the first nano-twins copper grains 413 extend into the second nano-twins copper layer 422, for example, 413a and 413b in FIG. 6. The first nano-twins copper grains 413a, 413b extending into the second nano-twins copper layer 422 can also be referred to as "merged nano-twins copper grains". Similarly, a certain amount of the second nano-twins copper grains 423 extend into the first nano-twins copper layer 411, for example 423c and 423d in FIG. 6. The second nano-twins copper grains 423c, 423d extending into the first nano-twins copper layer 411 can also be referred to as "merged nano-twins copper grains".

Furthermore, in some embodiments, a certain amount of the "merged nano-twins copper grains" penetrate through the first nano-twins copper layer 411 and the second nano-twins copper layer 422, for example, 430 in FIG. 6. Therefore, the merged nano-twins copper grains 430 can be regarded as an extension of the first nano-twins copper grains 413 or an extension of the second nano-twins copper grains 423. A height of the merged nano-twins copper grains 430 is the sum of the thickness T1 of the first nano-twins copper layer 411 and the thickness T2 of the second nano-twins copper layer 422.

In some embodiments, the electrical connecting structure 400 further includes a discontinuous joining interface 440 between the first nano-twins copper layer 411 and the second nano-twins copper layer 422. The merged nano-twins copper grains 413a, 413b, 423c, 423d and 430 penetrate through the joining interface 440, such that the joining interface 440 is discontinuous.

In some embodiments, at least 20% by amount of the first nano-twins copper grains (such as nano-twins copper grains 413a, 413b) grow across the joining interface 440, or at least 20% by amount of the second nano-twins copper grains (such as nano-twins copper grains 423c, 423d) grow across the joining interface 440.

Referring to FIG. 6, a height H1 of the first nano-twins copper grains 413a, 413b across the joining interface 440 is at least 30% of the thickness T2 of the second nano-twins copper layer 422, such as 35%, 40%, 45%, 50%, 55%, 60%, 65%, 70%, 75%, 80%, 85%, 90%, 95%, or 100%. Alternatively, a height H2 of the second nano-twins copper grains 423c, 423d extending across the joining interface 440 is at least 30% of the thickness T1 of the first nano-twins copper layer 411, such as 35%, 40%, 45%, 50%, 55%, 60%, 65%, 70%, 75%, 80%, 85%, 90%, 95%, or 100%. In a specific example, the height H1 of the first nano-twins copper grains 413a, 413b across the joining interface 440 and/or the height H2 of the second nano-twins copper grains 423c, 423d across the joining interface 440 each ranges from about 0.1 micrometer to about 20 micrometers, such as 0.1 micrometer, 0.3 micrometers, 0.5 micrometers, 0.8 micrometers, 1.0 micrometers, 1.5 micrometers, 1.8 micrometers, 2.0 micrometers, 2.5 micrometers, 3.0 micrometers, 5 micrometers, 10 micrometers, or 15 micrometers.

In some embodiments, the first substrate 410 further includes a substrate 415 and a metal layer 417 on the substrate 415. The metal layer 417 is favorable in forming an underlayer of the nano-twins copper. The metal layer 417 may include a plurality of sub-layers. In one example, a titanium layer and a copper layer are sequentially formed by using a sputtering method, and therefore the copper layer in the metal layer 417 does not contain nano-twins copper grains. The first nano-twins copper layer 411 is in contact with the copper layer in the metal layer 417. In some examples, the first substrate 410 further includes an oxide layer 419 between the substrate 415 and the metal layer 417.

Similarly, the second substrate 420 further includes a substrate 425 and a metal layer 427 on the substrate 425. The metal layer 427 may include a titanium layer and a copper layer formed thereon. The second nano-twins copper layer 422 is in contact with the copper layer in the metal layer 427. In some examples, the second substrate 420 further includes an oxide layer 429 between the substrate 425 and the metal layer 427.

What is claimed is:

1. An electrical connecting structure having nano-twins copper, comprising:
    a first substrate having a first nano-twins copper layer, wherein the first nano-twins copper layer comprises a plurality of first nano-twins copper grains; and
    a second substrate having a second nano-twins copper layer, wherein the second nano-twins copper layer comprises a plurality of second nano-twins copper grains, the first nano-twins copper layer being joined with the second nano-twins copper layer;
    wherein at least a portion of the first nano-twins copper grains extend into the second nano-twins copper layer, or at least a portion of the second nano-twins copper grains extend into the first nano-twins copper layer;
    wherein a joining interface is between the first nano-twins copper layer and the second nano-twins copper layer, at least 20% by amount of the first nano-twins copper grains extend across the joining interface, or at least 20% by amount of the second nano-twins copper grains extend across the joining interface.

2. The electrical connecting structure of claim 1, wherein the first substrate and the second substrate each comprises an oxide layer and a metal layer, wherein the first nano-twins copper layer is positioned on the metal layer of the first substrate, whereas the second nano-twins copper layer is positioned on the metal layer of the second substrate.

3. The electrical connecting structure of claim 1, wherein a height of each of the first nano-twins copper grains extending across the joining interface is at least 30% of a thickness of the second nano-twins copper layer; or
    a height of each of the second nano-twins copper grains extending across the joining interface is at least 30% of a thickness of the first nano-twins copper layer.

4. The electrical connecting structure of claim 3, wherein the height of each of the first nano-twins copper grains extending across the joining interface ranges from about 0.1 micrometer to about 20 micrometers.

5. The electrical connecting structure of claim 1, wherein the first nano-twins copper grains and the second nano-twins copper grains are substantially columnar.

6. The electrical connecting structure of claim 1, wherein a width of each of the first nano-twins copper grains and the second nano-twins copper grains is less than 5 micrometers.

7. The electrical connecting structure of claim 1, wherein the first nano-twins copper grains and the second nano-twins copper grains are formed and stacked in a direction of [111] crystallographic axis.

* * * * *